(12) United States Patent
Kim

(10) Patent No.: US 7,846,777 B2
(45) Date of Patent: Dec. 7, 2010

(54) SEMICONDUCTOR DEVICE PACKAGE AND FABRICATING METHOD THEREOF

(75) Inventor: Sang Chul Kim, Busan (KR)

(73) Assignee: Dongbu Hitek Co., Ltd., Seoul (KR)

( * ) Notice: Subject to any disclaimer, the term of this patent is extended or adjusted under 35 U.S.C. 154(b) by 68 days.

(21) Appl. No.: 12/176,110

(22) Filed: Jul. 18, 2008

(65) Prior Publication Data

US 2009/0020881 A1    Jan. 22, 2009

(30) Foreign Application Priority Data

Jul. 19, 2007    (KR)    ...................... 10-2007-0072163

(51) Int. Cl.
*H01L 21/768*    (2006.01)

(52) U.S. Cl. .................. 438/121; 257/773; 257/E23.17; 257/E21.585; 257/E21.499; 257/E21.519; 438/106; 438/55

(58) Field of Classification Search ................. 257/773, 257/E23.17, E21.585, E21.499, E21.519; 438/121, 55, 106, 15
See application file for complete search history.

(56) References Cited

U.S. PATENT DOCUMENTS

| 5,250,843 | A | * | 10/1993 | Eichelberger | ............... | 257/692 |
| 5,366,906 | A | * | 11/1994 | Wojnarowski et al. | ........ | 438/17 |
| 2003/0011049 | A1 | * | 1/2003 | Nuytkens et al. | ............ | 257/666 |
| 2005/0254215 | A1 | | 11/2005 | Khbeis et al. | | |

* cited by examiner

*Primary Examiner*—Wael M Fahmy
*Assistant Examiner*—Marc Armand
(74) *Attorney, Agent, or Firm*—Workman Nydegger

(57) ABSTRACT

A semiconductor device package and fabricating method thereof are disclosed, by which heat-dissipation efficiency is enhanced in a system by interconnection (SBI) structure. An exemplary semiconductor device package may include a substrate, at least two chips mounted on the substrate to have a space between one or more of the chips and an edge of the substrate, an insulating layer covering the chips, the insulating layer having via holes exposing portions of the at least two chips and a trench between the via holes, the insulating layer having at least two hole patterns within the space, and a metal layer filling the via holes and the trench.

7 Claims, 6 Drawing Sheets

[Fig. 1]
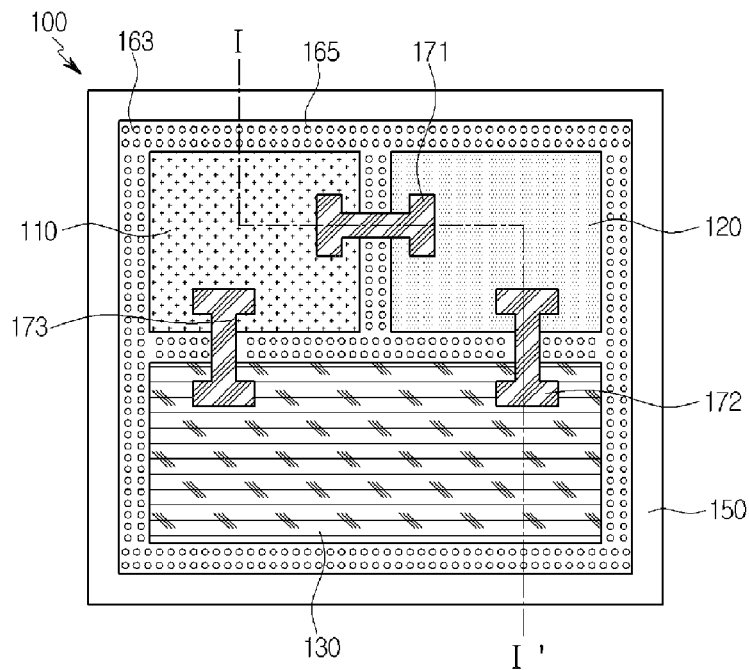
[Fig. 2]
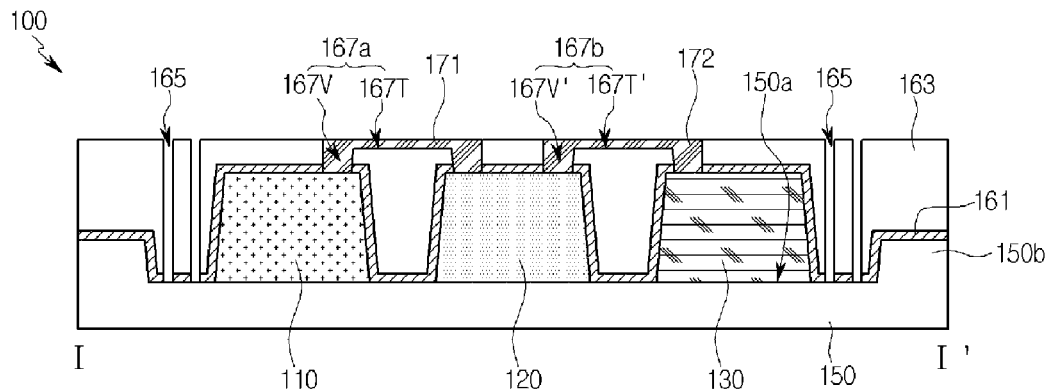
[Fig. 3]
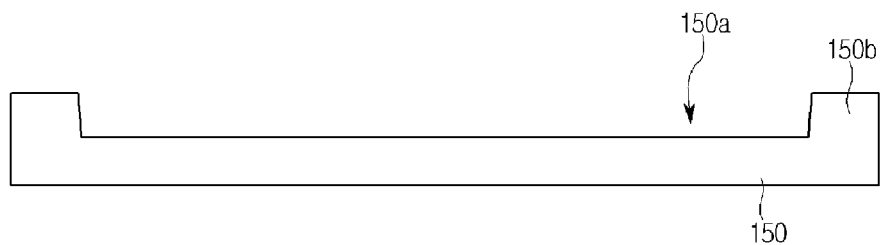

[Fig. 4]
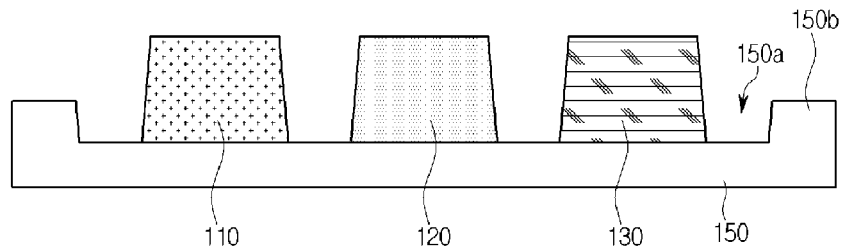
[Fig. 5]
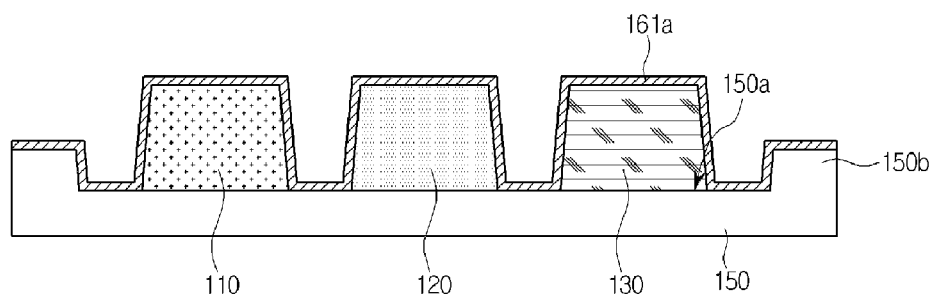
[Fig. 6]
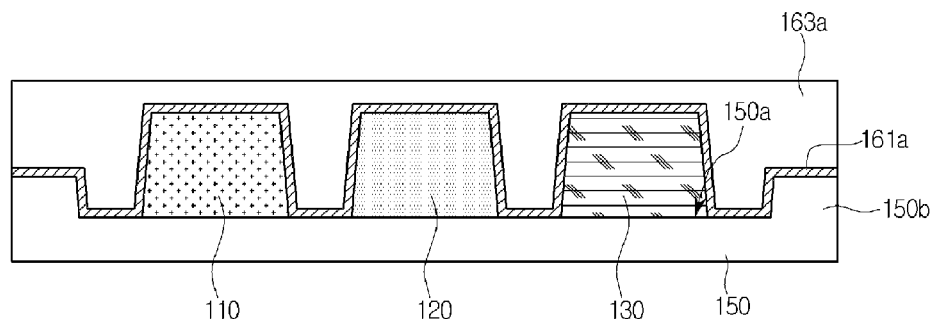
[Fig. 7]
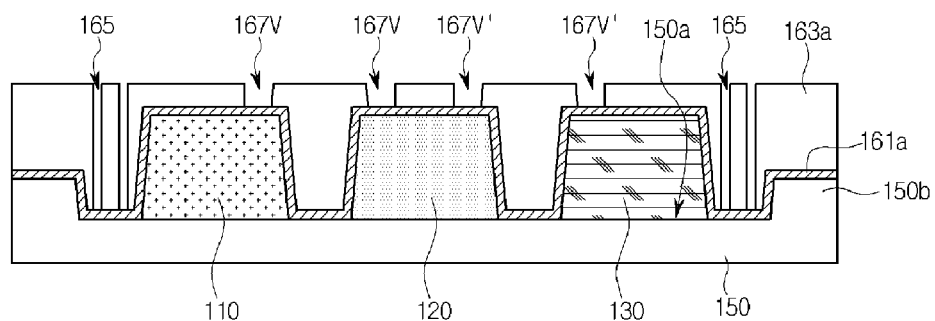

[Fig. 8]
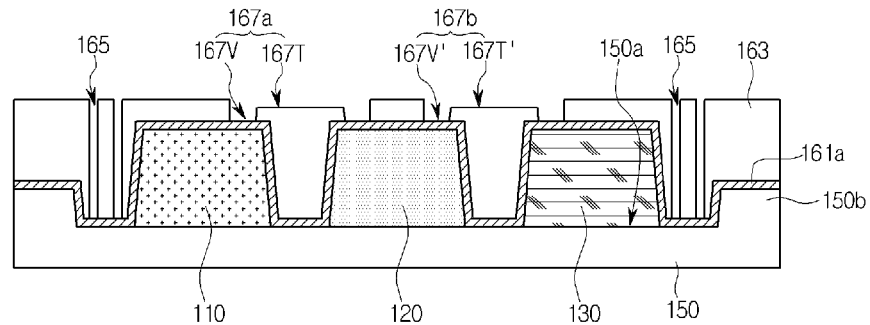
[Fig. 9]
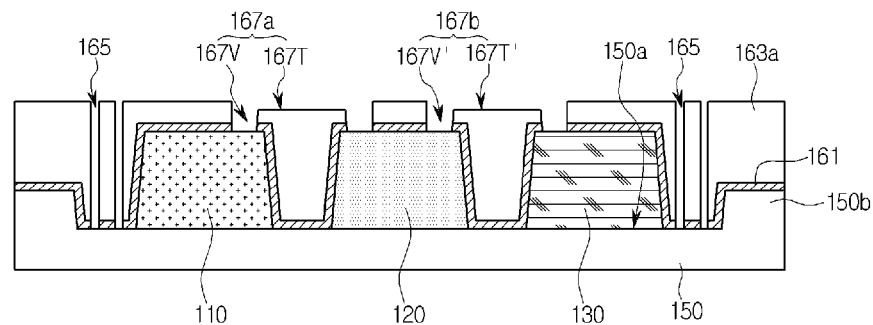
[Fig. 10]
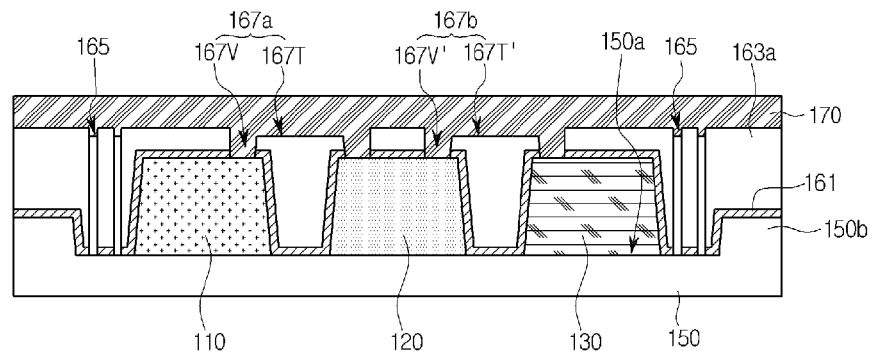
[Fig. 11]
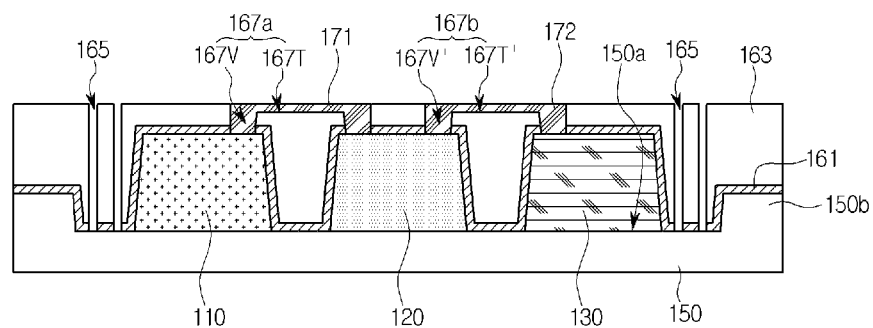

[Fig. 12]
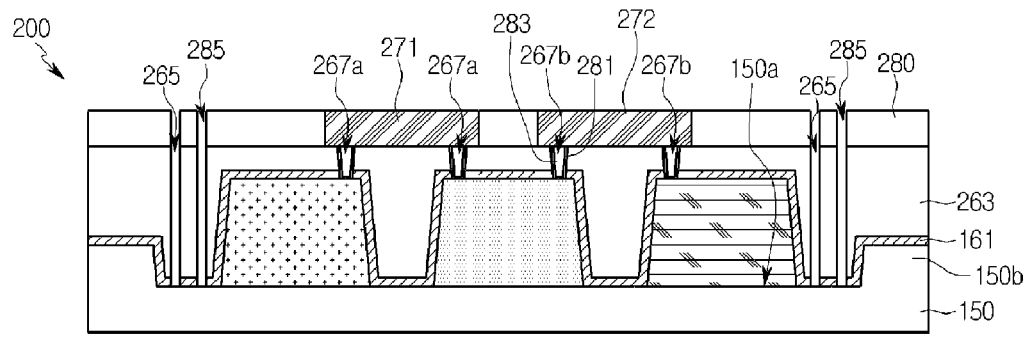
[Fig. 13]
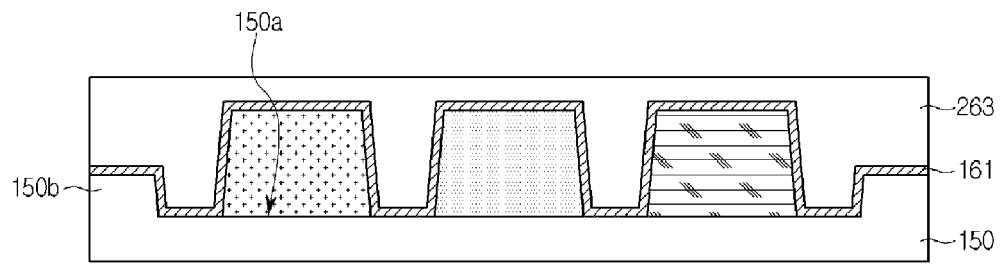
[Fig. 14]
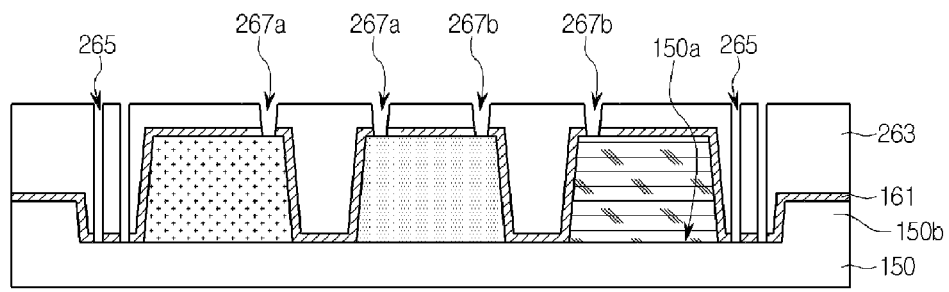
[Fig. 15]
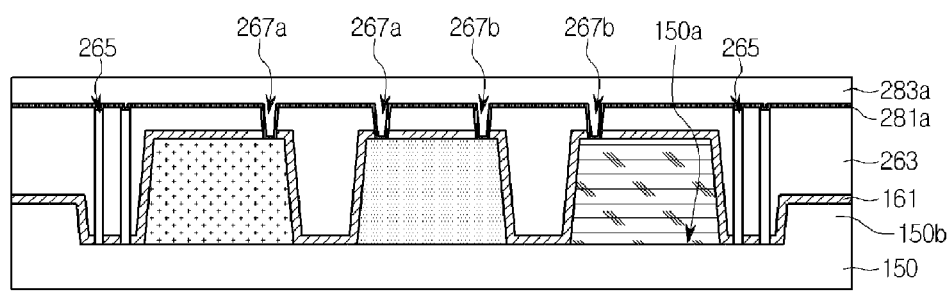

[Fig. 16]
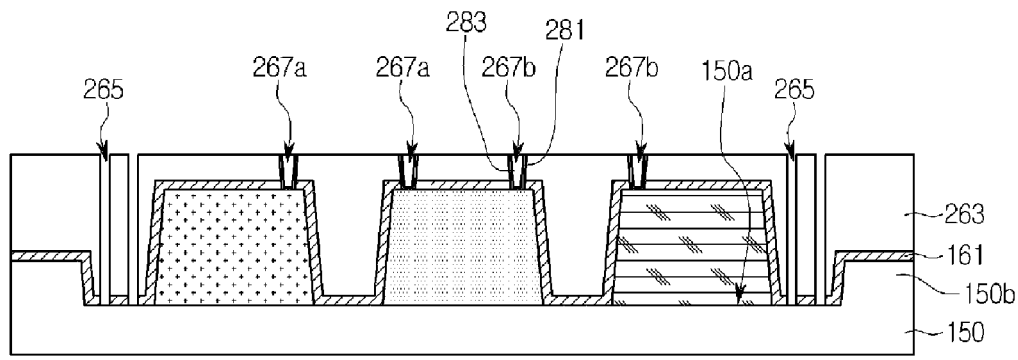
[Fig. 17]
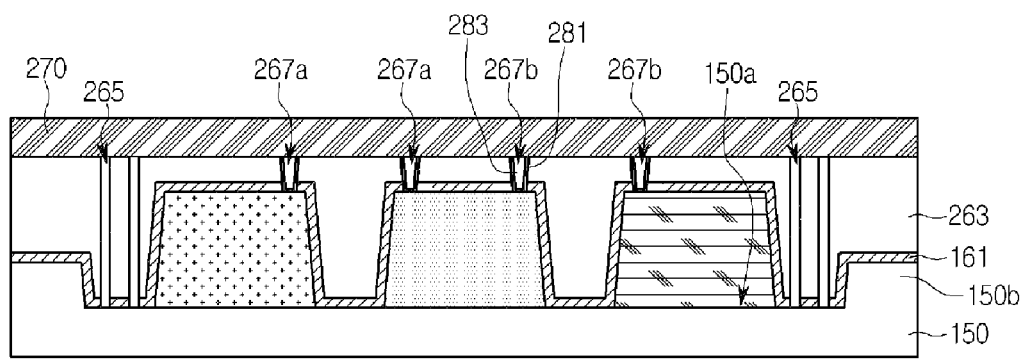
[Fig. 18]
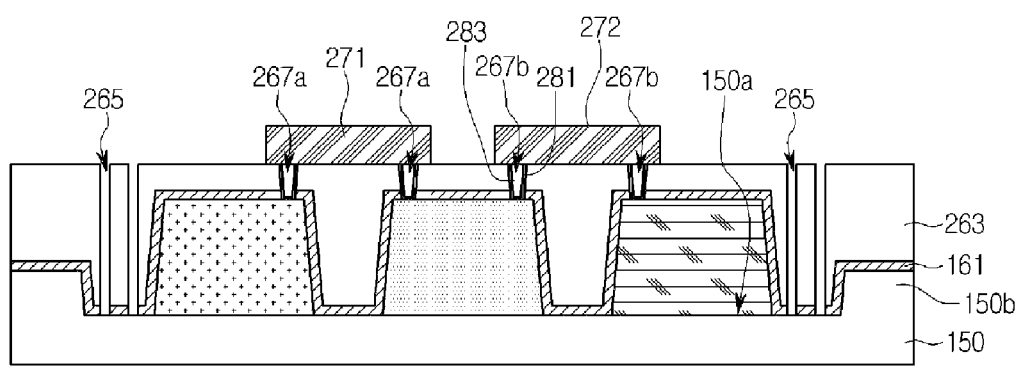

[Fig. 19]
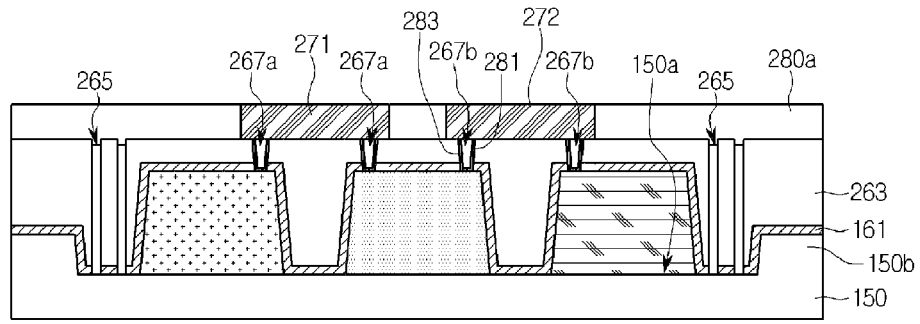
[Fig. 20]
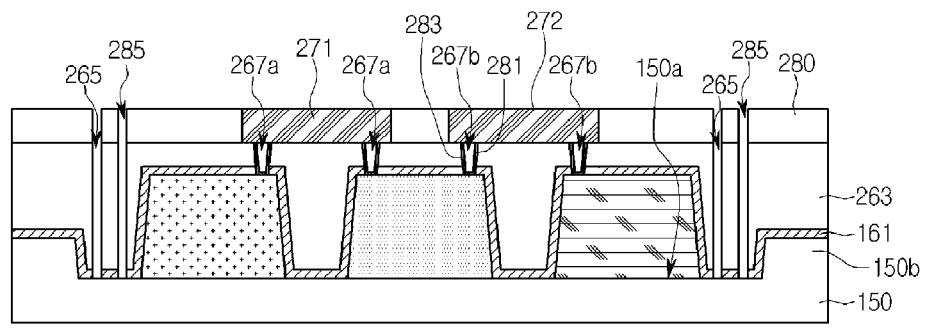
[Fig. 21]
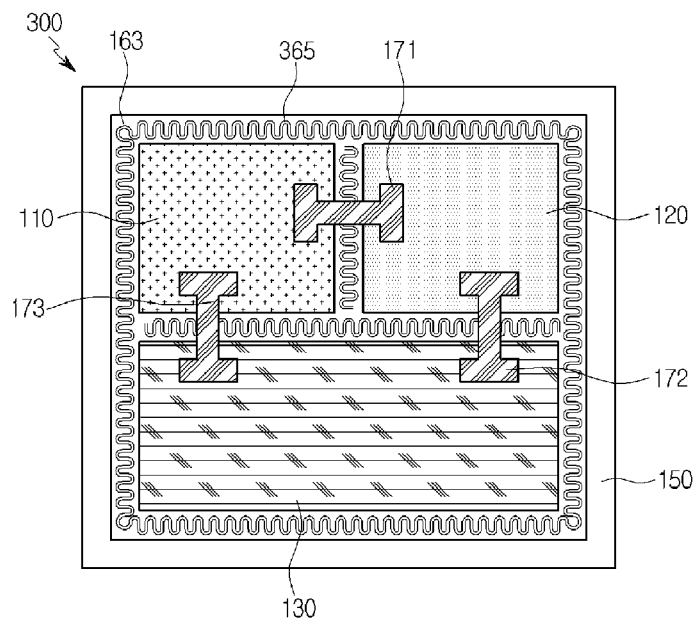

SEMICONDUCTOR DEVICE PACKAGE AND FABRICATING METHOD THEREOF

CROSS-REFERENCE TO RELATED APPLICATION

This application claims the benefit of the Korean Patent Application No. 10-2007-0072163, filed on Jul. 19, 2007, which is hereby incorporated by reference in its entirety.

BACKGROUND

1. Field

Embodiments of the present invention relate to a semiconductor device and, more particularly, to a semiconductor device package and fabricating method thereof. The embodiments are suitable for a wide scope of applications including a system by interconnection (SBI) structure.

2. Discussion of the Related Art

Generally, as a semiconductor device becomes reduced in size, it can be provided with more high-tech functions and consume less power. Therefore, there is rising demand for a smaller and lighter semiconductor device package.

However, packaging technology fails to keep up with the development of semiconductor technology with microscopic line width, highly-integrated cells, high-speed driving and the like.

For example, at least 50% of the total electric signal delay of certain high-speed semiconductor device package products is attributed to a package delay generated between chips. For certain larger systems at least 80% of the total expected electric signal delay can be attributed to the package delay. Therefore, improved packaging technology for semiconductor devices is becoming more important.

Moreover, since a semiconductor device package plays a role in dissipating heat generated from a chip, the heat generated from the semiconductor device package degrades performance of the semiconductor device, thus lowering reliability of the semiconductor device eventually.

SUMMARY

In general, example embodiments of the invention relate to a semiconductor device package and fabricating method thereof, by which heat dissipation efficiency is enhanced.

According to one embodiment, a semiconductor device package includes a substrate, at least two chips mounted on the substrate to have a space between one or more of the chips and an edge of the substrate, an insulating layer covering the chips, the insulating layer having via holes exposing portions of the at least two chips and a trench between the via holes, the insulating layer having at least two hole patterns within the space, and a metal layer filling the via holes and the trench.

According to a second embodiment, a semiconductor device package includes a substrate having a valid area and a non-valid area around the valid area, at least two chips mounted on the valid area of the substrate, and an insulating layer formed on the substrate including the mounted at least two chips to have a first heat-dissipation hole pattern on the non-valid area.

According to a third embodiment, a method of fabricating a semiconductor device package includes the steps of mounting at least two chips on a substrate such that the at least two chips are arranged to be spaced apart from each other to form a first space and to be spaced apart from an edge of the substrate to form a second space, forming an insulating layer on the substrate having the at least two chips mounted thereon, forming via holes exposing portions of the at least two chips and at least two hole patterns in at least one of the first and second spaces by etching the insulating layer selectively, forming a trench between the via holes to connect the via holes by etching the insulating layer selectively, forming a metal layer on the insulating layer including the at least two hole patterns, the via holes, and the trench, and forming a metal wire by polishing a portion of the metal layer formed above the via holes and the trench.

According to a fourth embodiment, a method of fabricating a semiconductor device package includes the steps of mounting at least two chips on a valid area of a substrate divided into the valid area and a non-valid area, forming an insulating layer on the substrate having the at least two chips mounted thereon, and forming a heat-dissipation hole pattern to expose a portion of the non-valid area by etching the insulating layer selectively.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features will be set forth in the description which follows, and in part will be obvious from the description, or may be learned by the practice of the teachings herein. Features of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

The accompanying drawings, which are included to provide a further understanding of example embodiments of the invention and are incorporated in and constitute a part of this application, illustrate the example embodiments and together with the description serve to explain particular features of the example embodiments. In the drawings:

FIG. 1 is a layout of a semiconductor device package according to an exemplary embodiment of the present invention;

FIG. 2 is a cross-sectional diagram of a semiconductor device package bisected along a cutting line I-I' in FIG. 1;

FIGS. 3 to 11 are cross-sectional diagrams of a process for fabricating a semiconductor device package according to an exemplary embodiment of the present invention;

FIG. 12 is a cross-sectional diagram of a semiconductor device package according to another exemplary embodiment of the present invention;

FIGS. 13 to 20 are cross-sectional diagrams of a process for fabricating a semiconductor device package shown in FIG. 12; and FIG. 21 is a layout of a semiconductor device package according to a further exemplary embodiment of the present invention.

DETAILED DESCRIPTION OF SOME EXAMPLE EMBODIMENTS

In the following detailed description Reference will now be made in detail to the accompanying drawings, which show, by way of illustration, specific exemplary embodiments of the invention. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled. Wherever possible, the same reference numbers will be used throughout the drawings to refer to the same or like parts.

In the following description, it will be understood that reference to a member as 'first', 'second' or the like is intended to distinguish among individual members. Therefore, when members are referred to as 'first', 'second' or the like, it is apparent that at least two such members are provided and that each of the members may be selectively or exchangeably used.

Moreover, for convenience of explanation, sizes or dimensions of the respective elements shown in the drawings are depicted in an enlarged fashion. In addition, the ratios of the dimensions of the elements shown in the drawings may differ from those of the real dimensions.

Furthermore, not all elements shown in the drawings are necessarily included in a corresponding embodiment of the present invention, nor is the corresponding embodiment limited to the elements shown. Thus, certain elements may be added, removed, or increased/decreased in quantity.

FIG. 1 is a layout of a semiconductor device package according to one embodiment and FIG. 2 is a cross-sectional diagram of a semiconductor device package bisected along a cutting line I-I' in FIG. 1.

Referring to FIGS. 1 and 2, in a semiconductor device package 100, first to third chips 110, 120, and 130 may be mounted on a base substrate 150. Although three chips are shown in the exemplary embodiment, fewer than three or more than three chips may be mounted on the base substrate 150 as well. The first to third chips 110, 120, and 130 may be chips that are extracted from respective wafers but mounted as a single package to perform a higher function. For instance, each of the first to third chips 110, 120, and 130 can be selected from a semiconductor device group consisting of a sensor chip, static RAM (SRAM), dynamic RAM (DRAM) flash memory, a logic device, a power integrated chip (IC), a digital signal processing (DSP) chip, a central processing unit (CPU), a radio frequency (RF) IC, and a control IC.

The first to third chips 110, 120 and 130 may be electrically connected to each other to perform a single function. For example, the first chip 110 and the second chip 120 may be electrically connected to each other by a first wire 171, the second chip 120 and the third chip 130 may be electrically connected to each other by a second wire 172, and the third chip 130 and the first chip 110 may be electrically connected to each other by a third wire 173.

A loading part 150a may be formed on a top surface of the base substrate 150. For example, the loading part 150a may be formed by concavely etching the top surface of the base substrate 150. A bottom surface of the loading part 150a may be formed flat to enable the first to third chips 110, 120, and 130 to be placed thereon. Edges 150b of the base substrate 150 may be formed higher than the loading surface (i.e., bottom surface) of the loading part 150a.

The base substrate 150 may include a substrate formed of a hard material. For instance, the base substrate 150 may include a silicon substrate.

At least two of the first to third chips 110, 120 and 130 arranged on the base substrate 150 may be spaced apart from each other with a prescribed gap. For example, the first to third chips 110, 120, and 130 may be arranged such that each chip is spaced apart from one another. In addition, the first to third chips 110, 120, and 130 may also be arranged to form an unoccupied space between the chips and an edge 150b of the base substrate 150.

First and second insulating layers 161 and 163 may be formed over the base substrate 150 having the first to third chips 110, 120, and 130 mounted thereon. The first and second insulating layers 161 and 163 may planarize the base substrate 150 on which the first to third chips 110, 120, and 130 are mounted.

Via holes 167V for exposing the first and second chips 110 and 120 may be formed in the first and second insulating layers 161 and 163. Trench 167T may be formed in the second insulating layer 163 to connect the via holes 167V. The via holes 167V and the trench 167T may form a first hole pattern 167a that exposes pad parts of the first chip 110 and pad parts of the second chip 120.

Other via holes 167V' for exposing the second and third chips 120 and 130 may be formed in the first and second insulating layers 161 and 163. Trench 167T' may be formed in the second insulating layer 163 to connect the via holes 167V'. The via holes 167V' and the trench 167T' may form a second hole pattern 167b that exposes pad parts of the second chip 120 and pad parts of the third chip 130.

The first hole pattern 167a may be filled up with metal material such as Cu to form a first wire 171 that electrically connects the first and second chips 110 and 120 together. Analogously, the second hole pattern 167b may be filled up with metal material such as Cu to form a second wire 172 that electrically connects the second and third chips 120 and 130 together.

The first and second insulating layers 161 and 163 may have one or more third hole patterns 165 that expose the base substrate 150. The third hole patterns 165 play a role in dissipating heat generated from driving the first to third chips 110, 120 and 130.

The third hole patterns 165 may be placed in a space between at least two of the first to third chips 110, 120 and 130 and in a space between at least one of the first to third chips 110, 120, and 130 and at least one of the edges 150b of the base substrate 150.

Horizontal cross-sections of the third hole patterns 165 may include a pattern of figures, such as circles, ellipses, triangles, quadrangles, or the like. The third hold patterns 165 may also have various shapes to maximize a heat-dissipation effect. For example, the third hole pattern 165 may have a shape such as a zigzag on a plane.

A width of each hole in the third hole patterns 165 may range from 1,000 to 5,000 Å or, in some embodiments, from 1,000 to 2,000 Å. An aspect ratio of vertical depth to horizontal width in each hole in the third hole patterns 165 may be substantially 10:1. In particular, each of the holes in the third hole patterns 165 may be formed to have a vertical depth longer than a horizontal width.

The holes formed by third hole patterns 165 advantageously increase a surface area of the insulating layer 163 and introduce a layer of air, for example. As a result, the semiconductor device package has improved dissipation of the heat generated when driving one or more of the chips 110, 120, and 130.

FIGS. 3 to 11 are cross-sectional diagrams of an exemplary process for fabricating a semiconductor device package such as that shown in FIGS. 1 and 2.

Referring to FIG. 3, a base substrate 150 may be prepared. The base substrate 150 may include a substrate formed of a hard material. For instance, the base substrate 150 may include a silicon substrate.

The base substrate 150 may be provided with a loading part 150a to have chips mounted thereon, which may include a recess formed on a top surface of the base substrate 150. The base substrate 150 may include an area on which the chips are mounted (i.e., a valid area) and an area on which the chips are not mounted (i.e., a non-valid area). The loading part 150a may include the valid area at least.

Edges 150b of the base substrate 150 can be formed higher than a loading surface (i.e., bottom surface) of the loading part 150a.

Referring to FIG. 4, first to third chips 110, 120 and 130 may be arranged on the loading part 150a of the base substrate 150.

Referring to FIG. 5, a first preliminary insulating layer 161a may be formed over the base substrate 150, on which the first to third chips 110, 120, and 130 are mounted, to cover the first to third chips 110, 120, and 130. The first preliminary insulating layer may include a nitride layer. In particular, the first preliminary insulating layer 161a may include a silicon nitride layer. Moreover, the first preliminary insulating layer 161a may include an etch-stop layer.

Referring to FIG. 6, a second preliminary insulating layer 163a may be formed on the first preliminary insulating layer 161a. The second preliminary insulating layer 163a may include an oxide layer. For instance, the second preliminary insulating layer 163a may include a silicon oxide layer.

Referring to FIG. 7, via holes 167V and 167V' and third hole patterns 165 may be formed by patterning the second preliminary insulating layer 163a. (At this stage, the first preliminary insulating layer 161a is not patterned.) The via holes 167V and 167V' may expose prescribed areas of the second and third chips 120 and 130. The exposed areas may correspond to pad parts thereof.

In forming the second preliminary insulating layer 163a, the via holes 167V and 167V' may differ from the third hole patterns 165 in etch depth. Yet, since the first preliminary insulating layer 161a is used as an etch-stop layer, it is able to prevent the chip from being damaged during formation of the via holes 167V and 167V'.

Referring to FIG. 8, the second insulating layer 163 may be formed by patterning and selectively etching the second preliminary insulating layer 163a to form trenches 167T and 167T'.

The trenches 167T and 167T' may be formed between via holes 167V for connecting the first and second chips 110 and 120 electrically or between via holes 167V' for connecting the second and third chips 120 and 130 electrically. In particular, the trench 167T may be formed by partially etching a portion of the second preliminary insulating layer 163a between the via holes 167V on the first and second chips 110 and 120 to be thinner than adjacent portions of the second preliminary insulating layer 163a. Analogously, the other trench 167T' may be formed by partially etching a portion of the second preliminary insulating layer 163a between the via holes 167V' on the second and third chips 120 and 130 to be thinner than adjacent portions of the second preliminary insulating layer 163a.

Thus, a first hole pattern 167a, including the via holes 167V on the first and second chips 110 and 120 and the trench 167 located between the via holes 167V, may be formed. In addition, a second hole pattern 167b, including the via holes 167V' on the second and third chips 120 and 130 and the trench 167T' located between the via holes 167V', may thus be formed.

The third hole patterns 165 may be formed in the spaces between each of the first to third chips 110, 120 and 130 or between the chips 110, 120 and 130 and the edge 150b of the base substrate 150.

A width of each of the holes in the third hole patterns 165 may range from 1,000 to 5,000 Å or, in some embodiments, from 1,000 to 2,000 Å. Furthermore, an aspect ratio of each of the third hole patterns 165 may be substantially 10:1 (vertical depth:horizontal width). In particular, each of the holes in the third hole patterns 165 may be formed to have a vertical depth longer than a horizontal width.

The semiconductor device package 100 fabricated according to the foregoing exemplary principles and techniques may advantageously dissipate heat generated from driving a chip due, at least in part, to an increased surface area introduced in the insulating layer 163 by the third hole patterns 165.

Referring to FIG. 9, portions of the second and third chips 120 and 130 may be exposed by etching corresponding portions of the first preliminary insulating layer 161a exposed via the first and second hole patterns 167a and 167b. Moreover, by etching portions of the first preliminary insulating layer 161a exposed through the third hole patterns 165, corresponding portions of the base substrate 150 may be exposed. In this manner a first insulating layer 161 may be formed upon etching the first preliminary insulating layer 161a.

Referring to FIG. 10, a metal layer 170 may be formed on the second insulating layer 163. The metal layer 170 may include, for example, a Cu metal layer.

The Cu metal layer may be formed by electrochemical plating. Thickness of a seed metal layer of the metal layer 170 may be set similar to a size or width of one or more holes in the third hole pattern 165. The seed layer of the metal layer 170 may be formed such that it covers topsides of holes in the third hole patterns 165, thereby forming voids within the holes in the third hole patterns 165. The seed metal layer of the metal layer 170 may also be formed to fill insides of holes in the first and second hole patterns 167a and 167b to electrically connect the chips 110 and 120 together.

Referring to FIG. 11, an upper surface of the metal layer 170 may be polished by chemical mechanical polishing (CMP) until the second insulating layer 163 is exposed. Therefore, portions of the metal layer 170 covering the topsides of the holes in the third hole patterns 165 may be removed by the CMP to open the holes in the third hole patterns 165.

A thickness or depth for polishing the second insulating layer 163 by the CMP may be set so as not to expose either of the trenches 167T and 167T' between the respective via holes 167V and 167V' formed on the chips 110, 120, and 130. Moreover, the polishing thickness or depth may be set high enough to open the holes in the third hole patterns 165.

Thus, the portion of metal layer 170 filling the inside of holes in the first hole pattern 167a forms a first wire 171 electrically connecting the first and second chips 110 and 120. Analogously, the portion of metal layer 170 filling the inside of holes in the second hole pattern 167b forms a second wire 172 electrically connecting the second and third chips 120 and 130. The first and second wires 171 and 172 may be electrically insulated from each other by the second insulating layer 163.

Since topsides of holes in the third hole patterns 165 are open to increase a surface area of the insulating layer, the semiconductor device package 100 is able to efficiently dissipate the heat generated from driving the chips.

FIG. 12 is a cross-sectional diagram of a semiconductor device package 200 according to another exemplary embodiment. In a semiconductor device package 200 according to FIG. 12, parts equivalent to those of the exemplary embodiment described with reference to FIG. 2 are indicated by the same reference numbers.

Referring to FIG. 12, first to third chips 110, 120 and 130 may be mounted on a loading part 150a of a base substrate 150.

First insulating layer 161 may be formed to cover the first to third chips 110, 120, and 130. A second insulating 263 may then be formed to cover the first insulating layer 161. Moreover, first to third hole patterns 267a, 267b and 265 may be formed in the insulating layers 161 and 263.

The third hole patterns 265 may perforate the second and first insulating layers 263 and 161 to expose the base substrate 150 in part. The first hole patterns 267a may perforate the second and first insulating layers 263 and 161 to expose portions of the first and second chips 110 and 120. The exposed portions may include pad parts of first and second chips 110 and 120. The second hole patterns 267b may perforate the second and first insulating layers 263 and 161 to expose portions of the second and third chips 120 and 130. The exposed portions may include pad parts of second and third chips 120 and 130.

Barrier layer pattern 281 and via metal pattern 283 may be formed within one or more holes in the first and second hole patterns 267a and 267b. The barrier layer pattern 281 can include a single layer or a stacked layer formed of a plurality of layers stacked on one another. The barrier layer pattern 281 may include at least one material selected from the group consisting of Ti, Ti nitride, Ta, Ta nitride and TiSiN.

The via metal pattern 283 may include tungsten (W). However various other materials may be used to implement the via metal pattern 283.

Between the first and second chips 110 and 120, a first wire 271 may be formed. The first wire 271 may electrically connect the first and second chips 110 and 120 via the via metal patterns 283 formed within the holes in the first hole patterns 267a.

Between the second and third chips 120 and 130, a second wire 272 may be formed. The second wire 272 may electrically connect the second and third chips 120 and 130 via the via metal patterns 283 formed within holes in the second hole patterns 267b.

The first and second wires 271 and 272 may include at least one material selected from the group consisting of Cu, W, Al, Ti and Ta.

The third hole patterns 265 may be formed in spaces between each of the chips 110, 120 and 130 and may be formed in spaces between the chips 110, 120 and 130 and an edge 150b of the base substrate.

To enable holes in the third hole pattern 265 to be externally exposed or opened, a third insulating layer pattern 280 may be formed on the second insulating layer 263 having the first and second wires 271 and 272 formed thereon. The third insulating layer 280 may include, for example, a silicon oxide layer. The third insulating layer pattern 280 may also expose topsides of the first and second wires 271 and 272.

FIGS. 13 to 20 are cross-sectional diagrams of an exemplary process for fabricating a semiconductor device package shown in FIG. 12.

In FIG. 13, base substrate 150 may include a loading part 150a for enabling chips to be mounted thereon. The loading part 150 may include a recess formed on a topside of the base substrate 150. Moreover, an edge 150b of the base substrate 150 can be formed higher than a loading surface (i.e., bottom surface) of the loading part 150a.

Referring further to FIG. 13, first to third chips 110, 120 and 130 may be mounted on the loading part 150a of the base substrate 150.

First insulating layer 161 covering the first to third chips 110, 120, and 130 may be formed over the base substrate 150. A second insulating layer 263 may then be formed on the first insulating layer 161. The first insulating layer 161 may include a nitride layer and the second insulating layer 263 may include an oxide layer.

Referring to FIG. 14, first to third hole patterns 267a, 267b and 265 may be formed in the second and first insulating layers 263 and 161.

The first hole patterns 267a may perforate the second and first insulating layers 263 and 161 to expose portions of the first and second chips 110 and 120. The exposed portions may include pad parts of the first and second chips 110 and 120. The second hole patterns 267b may perforate the second and first insulating layers 263 and 161 to expose portions of the second and third chips 120 and 130. The exposed portions may include pad parts of the second and third chips 120 and 130. The third hole patterns 265 may perforate the second and first insulating layers 263 and 161 to expose portions of the base substrate 150.

A width of each of holes in the third hole patterns 265 may range from 1,000 to 5,000 Å or, in some embodiments, from 1,000 to 2,000 Å. Furthermore, an aspect ratio of each of the third hole patterns 265 may be substantially 10:1 (vertical depth:horizontal width). In particular, each of the holes in the third hole patterns 265 may be formed to have a vertical depth longer than a horizontal width.

A semiconductor device package 100 formed with the third hole patterns 265 according to one or more of the foregoing exemplary principles and techniques is advantageous at least with respect to improved dissipation of heat generated from driving a chip. The improved heat dissipation may be attributed at least in part to an increased proportion of surface area exposed to air.

A size or width of holes in the third hole pattern 265 may be smaller than that of holes in the first or second hole patterns 267a or 267b. The holes in third hole patterns 265 may also differ from the holes in first or second hole patterns 267a or 267b in depth. Yet, since the first insulating layer 161 is used as an etch-stop layer in etching the second insulating layer 263, it is able to protect the chips during formation of holes in the hole patterns 265, 267a, and 267b.

Referring to FIG. 15, a barrier layer 281a may be formed over the base substrate 150 including the second insulating layer 263. A via metal layer 283a may then be formed on the barrier layer 281a.

The barrier layer 281a and the via metal layer 283 are not deposited within holes in the third hole pattern 265. This is because the third hole pattern 265 is smaller in size than the first or second hole pattern 267a or 267b. For instance, a hole of the third hole pattern 265 is smaller than that of the first or second pattern 267a or 267b. Moreover, if the barrier layer 281a is deposited by physical vapor deposition (PVD) with a thickness greater than the size of the third hole pattern 265, overhang of the barrier layer 281a is generated at an opening of each hole in the third hole pattern 265. Therefore, a void may be formed within each hole in the third hole pattern 265.

Referring to FIG. 16, by polishing the barrier layer 281a and the via metal layer 283a by CMP, a barrier layer pattern 281 and a via metal pattern 283 may be formed within holes in the first and second hole patterns 267a and 267b only. A thickness of the CMP process may be set so as to open holes in the third hole patterns 265.

Although the holes in the third hole pattern 265 are externally opened again, whereby an air layer can be formed within the holes, the barrier layer pattern 281 and the via metal pattern 283 each remain on inner surfaces of holes in the first and second hole patterns 267a and 267b.

Referring to FIG. 17, a metal layer 270 may be formed over the base substrate 150 including the second insulating layer 263. The metal layer 270 may include, for example, Al.

The metal layer 270 may be formed over the substrate by PVD but without being formed within the holes in the third hole pattern 265. If the metal layer 270 is deposited with a thickness greater than the size of holes in the third hole pattern 265, the metal layer 270 is formed to cover the topsides of the holes in the third hole patterns 265. Thus the metal layer 270 may be formed with an overhang at an opening of each hole in the third hole pattern 265, whereby a void is generated within each hole in the third hole pattern 265.

Referring to FIG. 18, the metal layer 270 may be patterned to form first and second wires 271 and 272.

By patterning and selectively etching portions of the metal layer 270 corresponding to the topsides of the third hole patterns 265, holes can be opened to expose the voids in the third hole patterns 265. Portions of the metal layer 270 may also be etched to form the first wire 271 between the first and second chips 110 and 120 and to form the second wire 272 between the second and third chips 120 and 130. The first wire 271 may electrically connect the first and second chips 120 and 130 via the via metal pattern 283 formed within the holes in the first hole patterns 267a. Analogously, the second wire 272 may electrically connect the second and third chips 120 and 130 via the via metal pattern 283 formed within holes in the second hole patterns 267b.

Referring to FIG. 19, a third insulating layer 280a may be formed over the substrate having the first and second wires 271 and 272 formed thereon to planarize or protect the semiconductor device package 200. The third insulating layer 280a may include, for example, a silicon nitride layer.

The third insulating layer 280a may be formed so as to cover topsides of holes in the third hole patterns 265 thus forming a void within each of the holes. The third insulating layer 280a may also be formed to cover the first and second wires 271 and 272. The third insulating layer 280a may then be polished by CMP to expose topsides of the first and second wires 271 and 272.

Referring to FIG. 20, fourth hole patterns 285 may be formed in correspondence to the third hole patterns 265 by patterning the third insulating layer 280a. Thus, the third insulating layer 280a may be patterned to expose or open holes in the third hole patterns 265.

FIG. 21 is a layout of a semiconductor device package 300 according to a further exemplary embodiment of the present invention.

Referring to FIG. 21, a third hole pattern 365 can be formed in one or more spaces, e.g., between each of at least two of the first to third chips 110, 120, and 130 and/or between the chips 110, 120 and 130 and an edge 150b of a base substrate 150.

To increase a surface area of an insulating layer formed on the substrate 150 the third hole pattern 365 may be formed to have a zigzagged long hole.

Certain effects and/or advantages may be achieved by fabricating a semiconductor device package in accordance with one or more of the embodiments described herein including, for example, effective dissipation of heat generated from driving chips mounted in the semiconductor device package by the use of hole patterns located between and/or around the chips. In addition, both via holes on the chips and hole patterns for heat dissipation may be formed simultaneously, thereby facilitating rapid fabrication of the semiconductor device package. A semiconductor device fabricated in accordance with the embodiments described herein will have increased stability of operations and reliability.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of fabricating a semiconductor device package, comprising the steps of:
    mounting at least two chips on a substrate such that the at least two chips are arranged to be spaced apart from each other to form a first space and to be spaced apart from an edge of the substrate to form a second space;
    forming an insulating layer on the substrate having the at least two chips mounted thereon;
    forming via holes exposing portions of the at least two chips and at least two hole patterns in at least one of the first and second spaces by etching the insulating layer selectively;
    forming a trench between the via holes to connect the via holes by etching the insulating layer selectively;
    forming a metal layer on the insulating layer including the at least two hole patterns, the via holes, and the trench; and
    forming a metal wire by polishing a portion of the metal layer formed above the via holes and the trench.

2. The method of claim 1, wherein in the metal layer forming step, the metal layer is formed to be overhung at an opening of each of one or more holes in the at least two hole patterns to form a void within each of the one or more holes and wherein the via holes are filled up with the metal layer.

3. The method of claim 1, wherein in the step of forming the via holes and the at least two hole patterns in the space, the at least two hole patterns are formed in the first space between the at least two chips by etching the insulating layer selectively.

4. A method of fabricating a semiconductor device package, comprising the steps of:
    mounting at least two chips on a valid area of a substrate divided into the valid area and a non-valid area;
    forming an insulating layer on the substrate having the at least two chips mounted thereon; and
    forming a heat-dissipation hole pattern to expose a portion of the non-valid area by etching the insulating layer selectively;
    forming via hole patterns on the insulating layer to expose portions of the at least two chips, each of one or more holes in the via hole patterns having a width greater than that of a hole in the heat-dissipation hole pattern;
    forming a metal layer on the insulating layer including the heat-dissipation hole pattern and the via hole patterns; and
    forming a metal wire electrically connecting the at least two chips via holes in the via hole patterns by patterning the metal layer.

5. The method of claim 4, wherein in the metal layer forming step, the metal layer is formed in a manner of being overhung at an opening of each of one or more holes in the heat-dissipation hole pattern to form a void within each of the one or more holes in the heat-dissipation hole pattern and wherein the via holes are filled up with the metal layer.

6. A method of fabricating a semiconductor device package, comprising the steps of:
- mounting at least two chips on a valid area of a substrate divided into the valid area and a non-valid area;
- forming an insulating layer on the substrate having the at least two chips mounted thereon; and
- forming a heat-dissipation hole pattern to expose a portion of the non-valid area by etching the insulating layer selectively;
- forming via hole patterns on the insulating layer to expose portions of the at least two chips;
- forming a barrier layer and a via metal layer on the insulating layer including the heat-dissipation hole pattern and the via hole patterns;
- forming a barrier layer pattern and a via metal layer pattern within one or more holes in at least one of the via hole patterns by polishing the barrier layer and the via metal layer;
- forming a metal layer on the insulating layer including the barrier layer pattern and the via metal layer pattern; and
- forming a metal wire connecting the at least two chips electrically via the holes in the at least one via hole pattern by patterning the metal layer.

7. The method of claim 6, after the metal wire forming step, the method further comprising the steps of:
- forming a planarizing layer to cover the metal layer;
- exposing a topside of the metal wire by polishing the planarizing layer; and
- forming a hole pattern at a position of the planarizing layer corresponding to the heat-dissipation hole pattern on the insulating layer by patterning the planarizing layer to open holes in the heat-dissipation hole pattern on the insulating layer.

* * * * *